(12) United States Patent
Adler et al.

(10) Patent No.: US 8,374,279 B2
(45) Date of Patent: Feb. 12, 2013

(54) MODULATION DEVICE FOR A TRANSMISSION PATH, METHOD FOR SIGNAL PROCESSING IN A TRANSMISSION PATH, AND TRANSMISSION PATH HAVING THE MODULATION DEVICE

(75) Inventors: Bernd Adler, Neubiberg (DE); André Hanke, Neubiberg (DE)

(73) Assignee: Intel Mobile Communications GmbH, Neubiberg (DE)

( * ) Notice: Subject to any disclaimer, the term of this patent is extended or adjusted under 35 U.S.C. 154(b) by 1256 days.

(21) Appl. No.: 11/709,004

(22) Filed: Feb. 21, 2007

(65) Prior Publication Data

US 2007/0206702 A1  Sep. 6, 2007

(30) Foreign Application Priority Data

Feb. 24, 2006  (DE) .......................... 10 2006 008 790

(51) Int. Cl.
*H04L 27/00* (2006.01)
(52) U.S. Cl. ........ 375/295; 375/219; 375/296; 375/297; 375/376; 330/76; 330/82; 330/109; 330/127; 330/129; 330/147; 330/148; 330/149; 455/114.3; 327/147; 327/156
(58) Field of Classification Search .................. 375/295, 375/297, 302; 455/205, 313, 323; 332/103; 329/347; 330/10, 297
See application file for complete search history.

(56) References Cited

U.S. PATENT DOCUMENTS

| | | | | |
|---|---|---|---|---|
| 6,731,917 | B1 * | 5/2004 | Krishna | 455/205 |
| 7,058,139 | B2 * | 6/2006 | Duperray | 375/297 |
| 7,409,004 | B2 * | 8/2008 | Booth et al. | 375/295 |
| 2001/0030581 | A1 * | 10/2001 | Dent | 330/297 |
| 2003/0095608 | A1 | 5/2003 | Duperray | |
| 2003/0102910 | A1 * | 6/2003 | Sevic et al. | 330/10 |
| 2004/0038648 | A1 * | 2/2004 | Matsuura et al. | 455/101 |
| 2005/0190829 | A1 * | 9/2005 | Lu et al. | 375/224 |
| 2007/0040606 | A1 * | 2/2007 | Zhou et al. | 329/347 |
| 2007/0229180 | A1 * | 10/2007 | Shimizu et al. | 332/103 |
| 2008/0268789 | A1 * | 10/2008 | Plaumann et al. | 455/67.14 |

FOREIGN PATENT DOCUMENTS

| | | |
|---|---|---|
| EP | 1 095 427 B1 | 7/2003 |
| GB | 1 334 587 | 10/1973 |
| WO | WO 03043179 A2 | 5/2003 |

* cited by examiner

*Primary Examiner* — David Ometz
*Assistant Examiner* — Eboni Hughes
(74) *Attorney, Agent, or Firm* — Eschweiler & Associates, LLC

(57) ABSTRACT

A modulation device includes a signal input for receiving a data stream to be modulated and a first and a second signal output. At least one first complex component is derived from the data stream in a coding device. A first and a second high-frequency signal are output via the signal outputs. The first and second high-frequency signals are derived from the at least one first complex component and are distinguished by the fact that the second high-frequency signal has a phase shift of substantially 90° with respect to the first high-frequency signal.

13 Claims, 2 Drawing Sheets

MODULATION DEVICE FOR A TRANSMISSION PATH, METHOD FOR SIGNAL PROCESSING IN A TRANSMISSION PATH, AND TRANSMISSION PATH HAVING THE MODULATION DEVICE

REFERENCE TO RELATED APPLICATIONS

This application claims the benefit of the priority date of German application DE 10 2006 008 790.9, filed on Feb. 24, 2006, the contents of which are herein incorporated by reference in their entirety.

FIELD OF THE INVENTION

The invention relates to a modulation device for a transmission path and to a method for signal processing in a transmission path. The invention also relates to a transmission path having the modulation device and to a use of the modulation device.

BACKGROUND OF THE INVENTION

The amount of power that is allowed to be radiated is stipulated for many transmission systems, in particular in the field of mobile radio. This requirement imposed on the total radiated power (TRP) permits only slight deviations.

The high-frequency signals to be emitted are generally transmitted using lines which lead to a transmitting antenna, for example. If these lines are not terminated with the requisite line impedance, standing waves may propagate on them. In this case, a wave running on the line is reflected at the end of the line. The returning wave can then impair the wave running on the line. In the case of extreme mismatches, this may completely obliterate the wave running on the line. However, the extent to which the wave is obliterated also depends on the phase angle of the signal which is transmitted using the line and is intended to be emitted using an antenna, for example. Fluctuations in the radiated power may thus arise even if a constant power level has been set in a transmission path or an amplifier, for example. In order to make it possible to accurately set the power in a transmission path, the influence of the phenomena which obliterate signals which are intended to be emitted should be reduced and the voltage standing wave ratio (VSWR) should thus be improved.

One approach to this is to use a special power amplifier having a split signal path. The power of a high-frequency signal which is intended to be emitted could be split into two signal parts using a hybrid coupler. One part of the signal can be amplified by a respective amplifier without a phase shift, and a second part of the signal can be amplified by a respective amplifier after having been phase-shifted through 90° by the hybrid coupler. The power of the amplified signals is combined by a further hybrid coupler and is output to an antenna in the form of a transmission signal. However, the hybrid couplers in the power amplifier require a relatively large amount of space and, in addition, have an attenuating behavior which can be compensated for only by means of a higher gain and thus a greater amount of requisite power.

BRIEF DESCRIPTION OF THE DRAWINGS

The invention will be explained in detail below using exemplary embodiments and with reference to the drawings, in which.

DETAILED DESCRIPTION OF THE INVENTION

Figure 1:
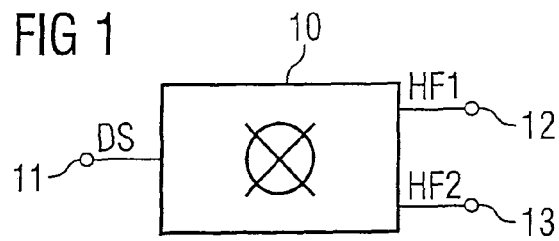
FIG. 1 shows a first exemplary embodiment of a modulation device.

The description below highlights various aspects and embodiments of the present invention. In addition, reference is made to the accompanying figures which form part of the description and use illustrations to show how the invention can be carried out in practice. The embodiments of the drawings represent various examples making it possible to gain a better understanding of one or more aspects of the present invention. This discussion is not intended to restrict the features or key elements of the invention to a particular embodiment. Rather, the different elements, aspects and features which are disclosed in the-exemplary embodiments can be combined in different ways by a person skilled in the art in order to achieve one or more advantages of the invention. It should be understood that other embodiments could be used and that structural or logical changes could be made without departing from the core idea of the present invention. The elements in the drawings are not necessarily true to scale with respect to one another.

Identical reference symbols denote similar parts which correspond to one another.

In one embodiment, a modulation device for a transmission path comprises a signal input for receiving a data stream to be modulated, a first signal output for outputting a first modulated high-frequency signal, and a second signal output for outputting a second modulated high-frequency signal. In this case, the first and second high-frequency signals are derived from the data stream. The second high-frequency signal also has a phase shift of essentially 90° with respect to the first high-frequency signal.

The data stream to be modulated represents the information which is intended to be transmitted using a transmission path. A carrier signal may be supplied to the modulation device. The carrier signal may be used to generate the modulated high-frequency signals from the data stream, the signal waveform of the high-frequency signals being suited to being emitted using an antenna following possible amplification.

Therefore the two high-frequency signals comprise, in modulated form, the same information represented in the data stream. They essentially differ by virtue of the phase difference between them. The latter should normally be 90° but slight deviations, for example on account of inaccurate circuit elements, are also possible. The high-frequency signals may be supplied to two power amplifiers without relying on a hybrid coupler for splitting the signals in an amplification device. The phase shift advantageously makes it possible to reduce the influence of a returning wave and thus to improve the voltage standing wave ratio of a transmission signal that is generated from the high-frequency signals.

In one embodiment, a coding device for deriving at least one first complex component from the data stream is provided. In this case, the high-frequency signals are derived on the basis of the at least one first complex component.

FIG. 1 shows one exemplary embodiment of a modulation device 10 having a signal input 11 which is used to supply a data stream DS to be modulated. The modulation device 10 has a first signal output 12 and a second signal output 13 which are used to output the first modulated high-frequency signal HF1 and the second modulated high-frequency signal HF2. The high-frequency signals have a phase shift of essentially 90° with respect to one another. The signals are phase-shifted and modulated in the modulation device 10 on the basis of the supplied data stream DS.

A modulation type with pure phase modulation may be used in one embodiment as the modulation type. This is also referred to as constant envelope modulation. Examples of this are the so-called frequency shift keying (FSK), in which the information to be transmitted is coded in the form of a sudden frequency change or a phase shift, or Gaussian minimum shift keying (GMSK), in which the carrier phase changes continuously by ±90° with each data bit. However, in many modern communication systems, the information to be transmitted is coded using both the phase and the amplitude of a carrier signal. Examples of modulation types with phase modulation and amplitude modulation are, in particular, phase shift keying modulation schemes (PSK) such as quadrature PSK (QPSK).

Figure 5:
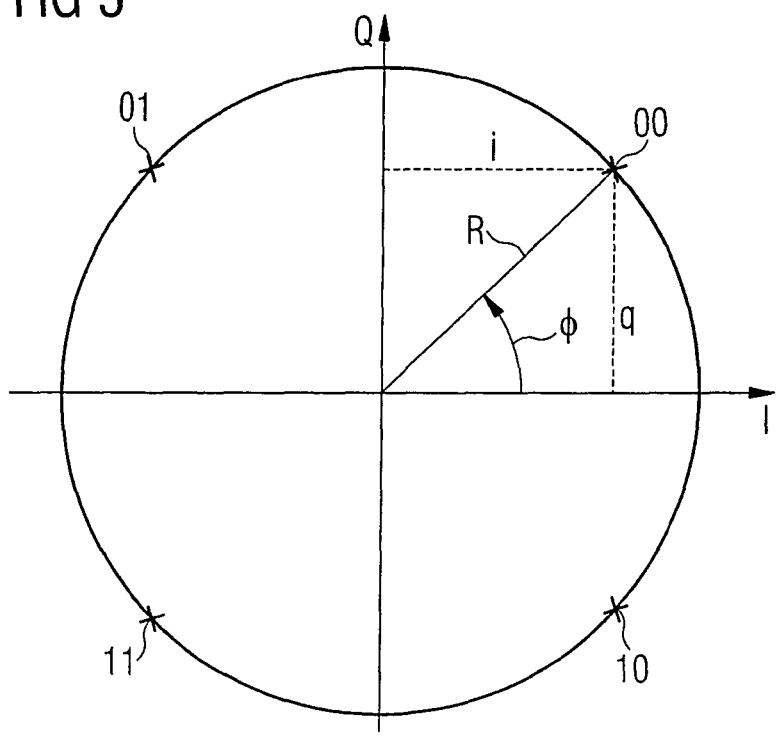
FIG. 5 shows a constellation diagram.

FIG. 5 shows a constellation diagram for illustrating data transmission with the aid of the QPSK modulation type. In this case, the x axis represents a first, real component I which is also referred to as an in-phase component. The y axis forms a second component Q, the so-called quadrature component. The information to be transmitted is coded by a value pair I, Q on the basis of its content at one of the points represented. Such a value pair I, Q is referred to as a symbol. In the example, a symbol thus represents a data content of two bits in the case of QPSK modulation. The amplitudes and phases of the I and Q values change over time on the basis of the data content to be coded, for example the bit sequence 01 11 10.

In addition to representing a symbol by a value pair I, Q, it is also possible to specify the phase Φ and amplitude R of the symbol, the polar representation of the symbol. In order to be able to transmit the information contained in the data stream DS, the information or the symbols in one embodiment is/are modulated onto a carrier signal, for example using polar or I/Q modulators.

In one embodiment, the modulation device comprises a phase shifter which is designed to output a first signal that is derived from an input signal applied to the input and at least one second signal that is derived from the input signal applied to the input. In this case, the second signal has a phase shift of essentially 90° with respect to the first signal.

In another embodiment, the modulation device comprises at least one modulator which is designed to modulate at least one component of a signal that is derived from the data stream to be modulated. In this case, the modulator may be based on an analog or digital modulation method.

Figure 2:
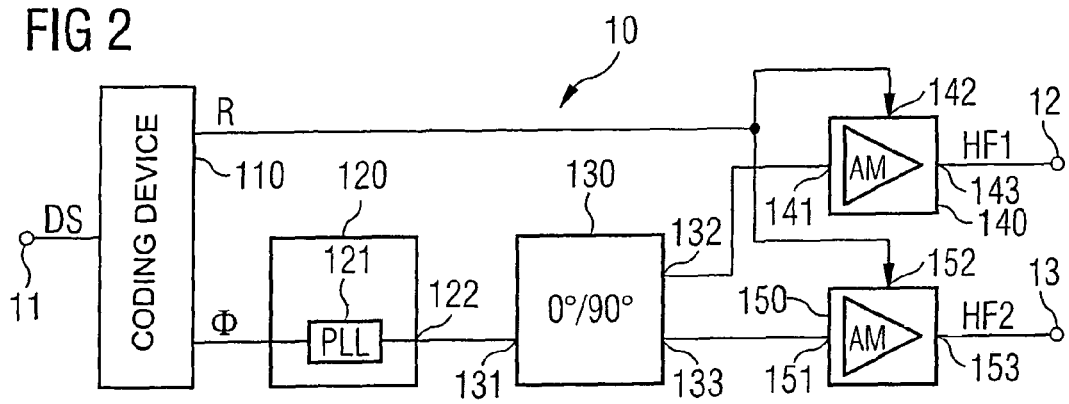
FIG. 2 shows a second exemplary embodiment of a modulation device.

FIG. 2 shows another exemplary embodiment of the modulation device, with polar modulation in this case. A coding device 110 which converts the information contained in the data stream DS into an amplitude component R and a phase component Φ is connected to the signal input 11 for supplying the data stream DS. The phase component Φ is output to a phase modulator 120 having a phase-locked loop 121. An output 122 of the phase modulator 120 is connected to an input 131 of a phase shifter 130. The modulation device 10 also has a first amplitude modulator 140 whose input 141 is coupled to a first output 132 of the phase shifter 130. An input 151 of a second amplitude modulator 150 is coupled to a second output 133 of the phase shifter 130.

The amplitude component R is supplied to the first amplitude modulator 140 via an input 142 and to the second amplitude modulator 150 via an input 152. A first high-frequency signal HF1 can be tapped off from the first signal output 12 which is coupled to an output 143 of the first amplitude modulator 140. A second high-frequency signal HF2 is output via the second signal output 13 which is coupled to an output 153 of the second amplitude modulator 150.

In the phase modulator 120, the phase component Φ is supplied to the phase-locked loop 121. In the phase-locked loop, the phase component Φ is used to generate the high-frequency phase-modulated signal. In the phase shifter 130,- the phase-modulated signal is used to derive two signals in which the second signal has a phase shift of essentially 90° with respect to the first signal. A frequency divider, in particular a divide-by-two divider, can be used, for example, for this purpose. However, the frequency division is taken into account when generating the phase-modulated signal in the phase modulator 130. The phase shifting can also be implemented using an RC-CR network, for example.

The two signals at the outputs 132 and 133 of the phase shifter 130 should still be considered to be phase-modulated signals and carry the same information in the phase component Φ. They differ only in terms of their phase angle with respect to one another and have a constant oscillation amplitude.

In the amplitude modulators 140 and 150, the amplitudes of the signals applied to the input are influenced on the basis of the amplitude information R. The amplitude modulation may be effected using a multiplier or a switch, for example. A multiplier can be implemented, for instance, using an amplifier whose supply voltage and/or supply current is/are varied on the basis of the amplitude information R. However, other types of mixers can also be used for the amplitude modulation and such alternatives are contemplated by the present invention.

The polar-modulated high-frequency signals HF1 and HF2 present at the output of the amplitude modulators 140 and 150 still have the desired phase shift of approximately 90° with respect to one another following the amplitude modulation. They are thus suited to reducing the influence of returning waves, for example from an antenna, and thus improving the voltage standing wave ratio of a transmission path. This makes it possible to set the power for a transmission path in a more accurate and substantially constant manner.

In one embodiment, the at least one modulator in the modulation device comprises a phase modulator whose input is coupled to the signal input. The phase shifter has an input which is coupled to the phase modulator as well as a first and a second output. In this case, the first output is designed to output the first high-frequency signal which is derived from a signal applied to the input. Furthermore, the second output is designed to output the second high-frequency signal which is derived from the signal applied to the input. The first signal output of the modulation device is coupled to the first output of the phase shifter and the second signal output is coupled to the second output of the phase shifter.

In the phase modulator, a phase-modulated signal is generated from the data stream. The signal is output to the phase shifter. The first and second high-frequency signals are derived from the signal in the phase shifter. Both signals are derived in the same manner but in such a way that the desired phase shift of 90° between the first and second high-frequency signals is achieved.

In one embodiment, the modulation device also comprises a first amplitude modulator, which is connected between the first output of the phase shifter and the first signal output, and a second amplitude modulator, which is connected between the second output of the phase shifter and the second signal output.

The amplitude modulation of the phase-modulated signals makes it possible to achieve polar modulation of the data represented by the data stream. Since the phase angle of the phase-modulated signals is not influenced by the amplitude modulation, the desired phase shift of substantially 90° is retained.

In one embodiment the phase modulator in the modulation device may comprise a phase-locked loop. In this case, a phase signal which is derived from the data stream is supplied as a controlled variable in the phase-locked loop. The output signal from the phase-locked loop can then be used as a phase-modulated signal.

Figure 3:
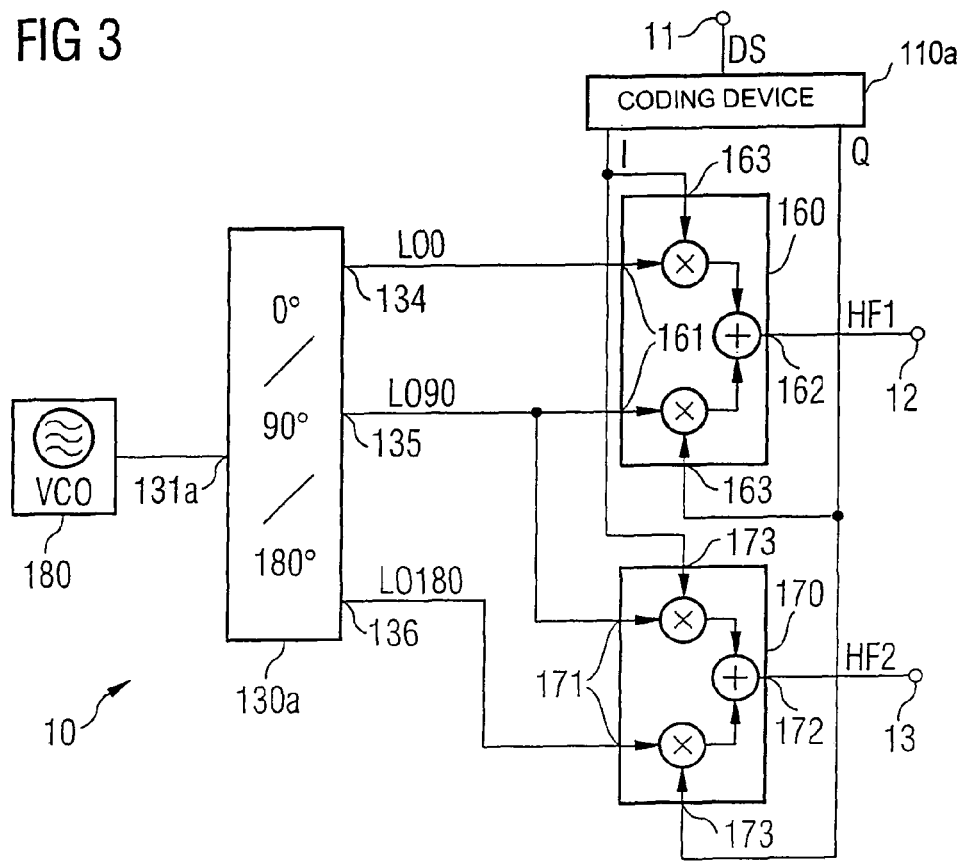
FIG. 3 shows a third exemplary embodiment of a modulation device.

FIG. 3 shows another exemplary embodiment of a modulation device in an embodiment with I/Q modulation. The modulation device 10 has a coding device 110a which is coupled to the signal input 11. Furthermore, the modulation device 10 comprises a first I/Q mixer 160 and a second I/Q mixer 170 as well as a frequency-generating device 180 and a phase shifter 130a.

A reference frequency signal which is output to an input 131a of the phase shifter 130a is generated in the frequency-generating device 180 which is in the form of a voltage-controlled oscillator (VCO) in one embodiment.

Three local oscillator signals LO0, LO90 and LO180 are derived from the reference frequency signal in the phase shifter 130a. In this case, all three local oscillator signals LO0, LO90 and LO180 are at the same frequency but differ in terms of their phase angle with respect to one another. The second local oscillator signal LO90 has a phase shift of 90° with respect to the first local oscillator signal LO0. The third local oscillator signal LO180 is distinguished by a phase shift of 180° with respect to the first local oscillator signal LO0. In the third exemplary embodiment too, the phase shift can be achieved using a divide-by-two divider or, as a non-exclusive alternative, using an RC-CR network. In particular, the third local oscillator signal LO180 may be derived by inverting the first local oscillator signal LO0.

The information contained in the data stream DS is converted into I/Q components in the coding device 110a. These components are supplied to an input 163 of the first I/Q mixer 160 and to an input 173 of the second I/Q mixer 170.

The input 161 of the first I/Q mixer 160 is coupled to the first and second outputs 134, 135 of the phase shifter 130a for supplying the first and second local oscillator signals LO0 and LO90. In a similar manner, an input 171 of the second I/Q mixer 170 is coupled to the second and third outputs 135 and 136 of the phase shifter 130a in order to supply the second and third local oscillator signals LO90 and LO180.

The I/Q components I, Q to be modulated and the local oscillator signals required for the modulation are thus applied to the I/Q mixers 160 and 170. The respective local oscillator signals which are supplied to an I/Q mixer have the phase shift of 90° with respect to one another, which phase shift is required for I/Q modulation. The high-frequency signals HF1 and HF2 are generated in the I/Q mixers 160 and 170 and are output at the outputs 162 and 172.

The high-frequency signals HF1 and HF2 carry the same information from the data stream DS in coded form. As a result of the arrangement shown, the desired phase shift of 90° between the high-frequency signals HF1 and HF2 is achieved and it is thus possible to improve the voltage standing wave ratio.

The use of the phase shifter and the two I/Q mixers results in less attenuation than a hybrid coupler which could be used to split a high-frequency signal into the phase-shifted signals.

In another embodiment, the modulation device also comprises a frequency-generating device as well as a first and a second I/Q mixer. In this case, the at least one modulator is in the form of the first or second I/Q mixer. A reference frequency signal is generated in the frequency-generating device. The phase shifter which has an input that is coupled to the frequency-generating device also comprises a first, a second and a third output. A first local oscillator signal is output at the first output, a second local oscillator signal is output at the second output and a third local oscillator signal is output at the third output. The local oscillator signals are derived from the reference frequency signal and are at the same frequency, the second local oscillator signal having a phase shift of essentially 90° with respect to the first local oscillator signal and the third local oscillator signal having a phase shift of essentially 180° with respect to the first local oscillator signal.

The first I/Q mixer has a signal input for supplying I/Q components to be modulated and a local oscillator input which is coupled to the first and second outputs of the phase shifter for supplying the first and second local oscillator signals. An output of the first I/Q mixer is coupled to the first signal output of the modulation device for outputting the first high-frequency signal which is derived from the signals applied to the input. The second I/Q mixer likewise has a signal input for supplying the I/Q components as well as a local oscillator input which is coupled to the second and third outputs of the phase shifter for supplying the second and third local oscillator signals. An output of the second I/Q mixer is coupled to the second signal output of the modulation device for outputting the second high-frequency signal which is derived from the signals applied to the input.

The I/Q components to be modulated, that is to say the I/Q components of a complex signal to be modulated, can be derived in this case from the data stream at the input of the modulation device. As a result of the special phase shift in the local oscillator signals from the phase shifter, the modulated high-frequency signals again have the desired phase shift of 90° with respect to one another.

Both in the embodiment with the phase modulator and in the embodiment with the I/Q mixers, the phase shifter may be in the form of a frequency divider, in particular in the form of a divide-by-two divider. It is relatively simple to provide signals which have been phase-shifted through 90° with respect to one another at the output of a frequency divider. Since the frequency of the output signal from the frequency divider is lower in this case than the frequency of the output signal, this must be taken into account when choosing the frequencies in the frequency-generating device. The third local oscillator signal which is required for the second I/Q mixer and has a phase shift of 180° can be generated by simply inverting the first local oscillator signal at the output of the frequency divider.

Figure 4:
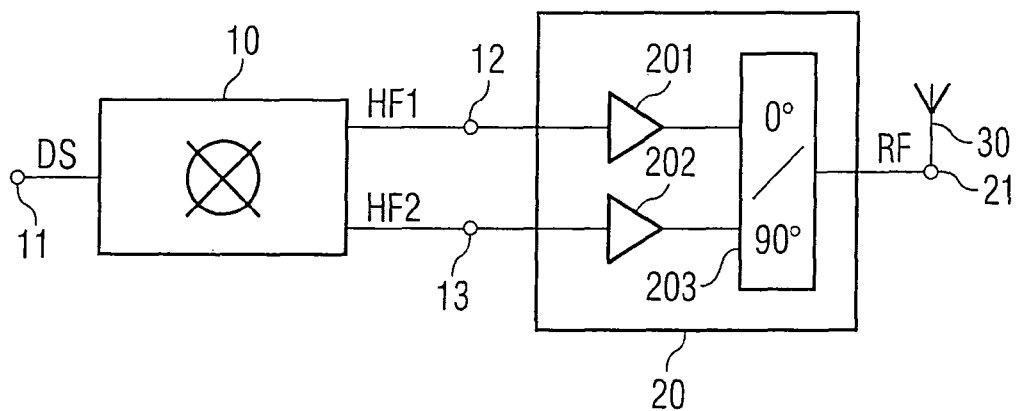
FIG. 4 shows an exemplary embodiment of a transmission path.

FIG. 4 shows one exemplary embodiment of a transmission path. A power amplification device 20 is coupled to the modulation device 10 having the first and second signal outputs 12 and 13. The power amplification device 20 comprises a first amplifier stage 201, which is coupled to the first signal output 12 of the modulation device 10, and a second amplifier stage 202, which is coupled to the second signal output 13. The outputs of the amplifier stages 201 and 202 are connected to a combining device 203. An antenna 30 is connected to the output of the combining device 203 which simultaneously represents the transmission output 21.

In the modulation device 10, the data stream is converted, in one of the embodiments described or in another manner, to form the high-frequency signals HF1 and HF2 which have been shifted through 90° with respect to one another. In order to transmit the signals using an antenna, the high-frequency signals HF1 and HF2 are amplified in two separate amplifier stages 201 and 202 for the requisite transmission power. In the combining device 203 which may be in the form of a hybrid coupler in one embodiment, the power of the amplified signals is combined and a transmission signal RF is thus generated by combining the signals. In this case, it should be ensured that the amplified signals are combined in the correct phase, as far as possible. The transmission signal RF itself should comprise only one phase angle and its signal waveform, for example, thus corresponds to the signal waveform of the first high-frequency signal HF1.

The first and second amplifier stages 201 and 202 may each be in the form of multistage power amplifiers. It is also possible to implement only the last stage, that is to say the final stage of a multistage amplifier, in the power amplification device 20 and to provide the respective preceding stages, that is to say the preliminary stages, in the modulation device 10.

When the arrangement is implemented using an integrated design, the modulation device 10 may be constructed in a separate area of a semiconductor body or as an independent component.

The combining device 203 not only combines the amplified high-frequency signals and outputs them to the antenna in the form of a transmission signal RF but also splits waves, which are returning from the antenna on account of a possible mismatch, between the two signal paths. Since obliteration of a signal depends on the phase angle of the returning wave, part of one of the two amplified signals may be obliterated in an unfavorable case. As a result of the overall reduced obliteration, the voltage standing wave ratio is improved and there are smaller fluctuations in the radiated power.

If polar modulation is used, the amplitude modulation could also be moved to the power amplification device.

In another embodiment of a transmission path having a modulation device according to one of the embodiments described, the transmission path comprises a power amplification device. The power amplification device has a first amplifier stage whose input is coupled to the first signal output and a second amplifier stage whose input is coupled to the second signal output. A combining device in the power amplification device is coupled to the first and second amplifier stages in order to combine signals, which have been amplified by the amplifier stages, in the correct phase to form a transmission signal, and has a transmission output for outputting the transmission signal.

This makes it possible in one embodiment to reduce the effects of a possible mismatch of a load that is connected to the transmission output and thus to improve the voltage standing wave ratio of the transmission path. In addition, the power consumption of the transmission path is reduced since there is no need to provide a hybrid coupler having power attenuation upstream of the amplifier stages.

As the load, the transmission signal in one embodiment can be output to an antenna, for example, by connecting the transmission output to an antenna. However, the arrangement cannot only be designed for an air interface formed by an antenna but also for a cable-based line interface, for example. The combining device in the power amplifier may be in the form of a hybrid coupler. In this case, a hybrid coupler is understood as meaning an arrangement for splitting or combining the power of high-frequency signals, with the correct amplitude, taking into account the phase angle. In this case, the fact of whether the power is split or combined depends on the propagation direction of a signal running via the hybrid coupler.

The modulation device or the transmission path can be used in a mobile radio.

In one embodiment of a method for signal processing in a transmission path, a data stream to be modulated is supplied to a transmission path. A first modulated high-frequency signal and a second modulated high-frequency signal are derived from the data stream. To this end, at least one first complex component which can be used for the modulation is derived, for example, from the data stream. The high-frequency signals are derived in such a manner that the second high-frequency signal has a phase shift of essentially 90° with respect to the first high-frequency signal. The phase shift between the high-frequency signals makes it possible to reduce the influence of returning waves in the event of a mismatch of a connected load. This makes it possible to set the power in the transmission path in a more accurate manner.

In another embodiment of the method, a phase-modulated signal is generated when deriving the high-frequency signals from the data stream. A phase shifter is used to derive the first and second high-frequency signals from the phase-modulated signal.

The information represented by the data stream is represented in the form of a phase-modulated signal using a phase modulator. The phase shifter results in the high-frequency signals having the required phase shift of approximately 90°.

In another embodiment of the method, the first and second phase-modulated high-frequency signals are additionally amplitude-modulated on the basis of the data stream. This results in the information represented by the data stream being subjected to polar modulation.

In another embodiment of the method, a reference frequency signal is first of all provided in the step of deriving the high-frequency signals. A first, a second and a third local oscillator signal are derived from the reference frequency signal, the second local oscillator signal having a phase shift of substantially 90° with respect to the first local oscillator signal and the third local oscillator signal having a phase shift of essentially 180° with respect to the first local oscillator signal. The local oscillator signals are at the same frequency.

In addition, I/Q components to be modulated are derived from the data stream. In a first I/Q mixer, the I/Q components are mixed with the first and second local oscillator signals to form the first high-frequency signal. In a similar manner to this, in a second I/Q mixer, the I/Q components are mixed with the second and third local oscillator signals to form the second high-frequency signal.

In another embodiment of the method, the first and second high-frequency signals are additionally amplified to form amplified signals. The amplified signals are then combined to form a transmission signal. Since the amplified signals also still have a phase shift of 90° with respect to one another, it should be ensured, when combining the amplified signals, that they are processed in the correct phase.

The phase shifts which are required when deriving signals which have been phase-shifted with respect to one other can be achieved, for example, using frequency dividers, in particular divide-by-two dividers.

Although only some specific refinements of the invention have been illustrated and described, a person skilled in the art can readily discern that any arrangement which is suitable for implementing the proposed principle can be replaced with the refinements specified. It becomes clear to a person skilled in the art that the above description is used, in particular, to explain the inventive principle and is thus not restrictive either. In particular, it is not restricted to the described embodiments of the invention.

The application covers all modifications and variations of the invention. Combinations of the above refinement and other embodiments are readily revealed to a person skilled in the art with the aid of the above description. The field of the invention also extends to applications which use the disclosed arrangements and methods. The scope of the invention should be determined taking into account the claims together with the equivalence range resulting from the claims.

It is emphasized that the abstract is enclosed in order to fulfill section 1.72(b) of the 37 C.F.R. which requires an abstract that makes it possible for a reader to quickly grasp the fundamental aspects of the technical teaching disclosed. It is submitted in the knowledge that the abstract is not used to interpret and restrict the scope of protection or the significance of the claims.

The invention claimed is:

1. A modulation device for a transmission path, comprising: a signal input configured to receive a data stream to be modulated; a first signal output configured to output a first modulated high-frequency signal;
   a second signal output configured to output a second modulated high-frequency signal; and
   a coding device configured to derive at least one first complex component from the data stream;
   wherein the modulation device is configured to derive the first and second modulated high-frequency signals from the at least one first complex component, wherein the first modulated high-frequency signal and the second modulated high-frequency signal each comprise, in modulated form, the same information represented in the received data stream, and
   wherein the second high-frequency signal comprises a phase shift of substantially 90° with respect to the first high-frequency signal;
   a phase shifter configured to output a first signal that is derived from an input signal associated with the at least one first complex component applied to an input thereof, and at least one second signal that is derived from the input signal associated with the at least one first complex component applied to the input, the second signal comprising a phase shift of substantially 90° with respect to the first signal;
   at least one modulator that is distinct from the coding device, and configured to modulate the at least one first complex component derived by the coding device to generate the input signal provided to the phase shifter,
   an amplitude modulator configured to receive the first high-frequency signal and the second high-frequency signal and generate a first amplitude modulated high-frequency signal and a second amplitude modulated high-frequency signal based on an amplitude modulation control signal provided by the coding device based on the data stream,
   wherein the first and second signals from the phase shifter are associated with the first and second modulated high-frequency signals, respectively.

2. The modulation device of claim 1, wherein:
   the at least one modulator comprises a phase modulator comprising an input coupled to an output of the coding device;
   the input of the phase shifter is coupled to an output of the phase modulator, and wherein the phase shifter comprises a first output configured to output the first high-frequency signal derived from the input signal applied to the input, and a second output configured to output the second high-frequency signal derived from the input signal applied to the input; and
   the first signal output is coupled to the first output of the phase shifter and the second signal output is coupled to the second output of the phase shifter.

3. The modulation device of claim 2, wherein the amplitude modulator further comprises:

a first amplitude modulator coupled between the first output of the phase shifter and the first signal output; and
a second amplitude modulator coupled between the second output of the phase shifter and the second signal output.

4. The modulation device of claim 2, wherein the phase modulator comprises a phase-locked loop.

5. The modulation device of claim 1, further comprising:
   a frequency-generating device configured to generate a reference frequency signal;
   wherein the phase shifter comprises an input coupled to the frequency-generating device, a first output configured to output a first local oscillator signal, a second output configured to output a second local oscillator signal, and a third output configured to output a third local oscillator signal, the local oscillator signals derived from the reference frequency signal, the second local oscillator signal comprising a phase shift of substantially 90° with respect to the first local oscillator signal, and the third local oscillator signal comprising a phase shift of substantially 180° with respect to the first local oscillator signal;
   a first I/Q mixer comprising a signal input configured to receive the at least one first complex component and a second complex component, that is derived from the data stream, the first and second complex components comprising I/Q components to be modulated, a local oscillator input coupled to the first output and to the second output of the phase shifter and configured to receive the first and second local oscillator signals, and an output coupled to the first signal output and configured to output the first high-frequency signal that is derived from the signals applied to the input; and
   a second I/Q mixer comprising a signal input configured to receive the I/Q components, a local oscillator input coupled to the second output and to the third output of the phase shifter and configured to receive the second and third local oscillator signals, and an output coupled to the second signal output and configured to output the second high-frequency signal that is derived from the signals applied to the input; and
   wherein the at least one modulator comprises the first I/Q mixer or the second I/Q mixer.

6. The modulation device of claim 1, wherein the phase shifter comprises a frequency divider.

7. A transmission path, comprising:
   a modulation device, comprising:
   a signal input configured to receive a data stream to be modulated;
   a first signal output configured to output a first modulated high-frequency signal;
   a second signal output configured to output a second modulated high-frequency signal;
   a coding device configured to derive at least one first complex component from the data stream;
   wherein the modulation device is configured to derive the first and second modulated high-frequency signals from the at least one first complex component,
   wherein the first modulated high-frequency signal and the second modulated high-frequency signal each comprise, in modulated form, the same information represented in the received data stream, and
   wherein the second modulated high-frequency signal comprises a phase shift of substantially 90° with respect to the first modulated high-frequency signal; and
   a phase shifter configured to output a first signal that is derived from an input signal associated with the at least one first complex component applied to an input thereof, and at least one second signal that is derived from the input signal associated with the at least one first complex component applied to the input, the second signal comprising a phase shift of substantially 90° with respect to the first signal; and at least one modulator that is distinct from the coding device, and configured to modulate the at least one first complex component derived by the coding device to generate the input signal provided to the phase shifter, wherein the first and second signals from the phase shifter are associated with the first and second modulated high-frequency signals, respectively;

a power amplifier, comprising:
- a first amplifier stage comprising an input coupled to the first signal output;
- a second amplifier stage comprising an input coupled to the second signal output,
- wherein the first and second amplifier stages receive the first and second signals that are high-frequency signals and amplitude modulate such first and second signals in accordance with an amplitude control signal that is based on the data stream to generate first and second amplitude modulated high-frequency signals; and
- a combining device coupled to the first and second amplifier stages, and configured to combine signals that have been amplified by the amplifier stages, the combined signals comprising a transmission signal, the combining device comprising a transmission output configured to output the transmission signal.

8. The transmission path of claim 7, wherein the transmission output is configured to couple to an antenna.

9. The transmission path of claim 7, wherein the combining device comprises a hybrid coupler.

10. A method for signal processing in a transmission path, comprising:
   receiving a data stream to be modulated;
   deriving at least one first complex component from the data stream;
   modulating the at least one first complex component;
   phase shifting the modulated at least one first complex component to obtain a first signal and a second signal, wherein the second signal exhibits a phase shift of substantially 90° with respect to the first signal;
   deriving a first modulated high-frequency signal and a second modulated high-frequency signal from the first signal and the second signal, respectively, wherein the first modulated high-frequency signal and the second modulated high-frequency signal each comprise, in modulated form, the same information represented in the received data stream, and wherein the second modulated high-frequency signal comprises a phase shift of substantially 90° with respect to the first modulated high-frequency signal; and
   amplitude modulating the first and second modulated high-frequency signals based on an amplitude modulation control signal that is based on the data stream.

11. The method of claim 10, further comprising deriving a second complex component from the data stream, and amplitude modulating the first and second high-frequency signals based on the second complex component.

12. The method of claim 10, wherein deriving the modulated high-frequency signals comprises:
   providing a reference frequency signal;
   deriving a first, a second and a third local oscillator signal from the reference frequency signal, wherein the second local oscillator signal comprises a phase shift of substantially 90° with respect to the first local oscillator signal, and the third local oscillator signal comprises a phase shift of substantially 180° with respect to the first local oscillator signal;
   mixing the at least one first complex component and a second complex component, that is derived from the data stream as I/Q components, with the first and second local oscillator signals to form the first high-frequency signal; and
   mixing the I/Q components with the second and third local oscillator signals to form the second high-frequency signal.

13. The method of claim 10, further comprising:
   amplifying the first and second high-frequency signals to form amplified signals; and
   combining the amplified signals to form a transmission signal.

* * * * *